United States Patent
Lakkis

(10) Patent No.: US 10,320,441 B2
(45) Date of Patent: *Jun. 11, 2019

(54) SYSTEMS AND METHODS FOR A SWITCHLESS RADIO FRONT END

(71) Applicant: Ubilite, Inc., Carlsbad, CA (US)

(72) Inventor: Ismail Lakkis, Carlsbad, CA (US)

(73) Assignee: UBILITE, INC., Carlsbad, CA (US)

( * ) Notice: Subject to any disclaimer, the term of this patent is extended or adjusted under 35 U.S.C. 154(b) by 12 days.

This patent is subject to a terminal disclaimer.

(21) Appl. No.: 15/784,957

(22) Filed: Oct. 16, 2017

(65) Prior Publication Data

US 2018/0041243 A1 Feb. 8, 2018

Related U.S. Application Data

(63) Continuation of application No. 15/187,549, filed on Jun. 20, 2016, now Pat. No. 9,793,942.

(51) Int. Cl.
| | |
|---|---|
| *H04B 1/44* | (2006.01) |
| *H03F 3/19* | (2006.01) |
| *H03F 3/217* | (2006.01) |
| *H03F 3/45* | (2006.01) |

(52) U.S. Cl.
CPC ............... *H04B 1/44* (2013.01); *H03F 3/19* (2013.01); *H03F 3/217* (2013.01); *H03F 3/45071* (2013.01); *H03F 2200/294* (2013.01); *H03F 2200/451* (2013.01); *H03F 2200/541* (2013.01); *H03F 2203/45228* (2013.01)

(58) Field of Classification Search
CPC ... H04B 1/44; H03F 3/19; H03F 3/217; H03F 3/45071; H03F 2203/45228; H03F 2200/451; H03F 2200/294; H03F 2200/541

See application file for complete search history.

(56) References Cited

U.S. PATENT DOCUMENTS

| | | | |
|---|---|---|---|
| 9,793,942 B1 * | 10/2017 | Lakkis | ............ H04B 1/44 |
| 2004/0102175 A1 | 5/2004 | Rofougaran | |
| 2004/0253939 A1 | 12/2004 | Castaneda et al. | |
| 2005/0043006 A1 | 2/2005 | Bhatti et al. | |
| 2005/0208901 A1 | 9/2005 | Chiu et al. | |
| 2005/0208917 A1 | 9/2005 | Roufoogaran et al. | |
| 2005/0208921 A1 | 9/2005 | Roufoogaran | |

(Continued)

*Primary Examiner* — Kenneth T Lam
(74) *Attorney, Agent, or Firm* — Procopio, Cory, Hargreaves & Savitch LLP

(57) ABSTRACT

A radio circuit, comprises an antenna; a differential power amplifier, comprising differential transmit inputs and differential transmit outputs, configured to amplify differential transmit signals received via the differential transmit inputs and output the amplified differential transmit signals via the differential transmit outputs; a differential low noise amplifier, comprising differential receive inputs and differential receive outputs, configured to receive differential receive signals via the differential receive inputs and output amplified differential receive signals via the differential receive outputs; and a transformer comprising a primary winding and a secondary winding, the primary winding coupled with the differential transmit outputs of the power amplifier and the differential receive inputs of the low noise amplifier and the secondary winding coupled with the antenna.

13 Claims, 3 Drawing Sheets

(56) References Cited

U.S. PATENT DOCUMENTS

| | | |
|---|---|---|
| 2006/0091958 A1 | 5/2006 | Bhatti et al. |
| 2007/0152904 A1 | 7/2007 | Castaneda et al. |
| 2008/0278258 A1 | 11/2008 | Liu |
| 2013/0267185 A1 | 10/2013 | Chen et al. |
| 2014/0199951 A1 | 7/2014 | Yu et al. |
| 2015/0094117 A1 | 4/2015 | Conta et al. |

* cited by examiner

SYSTEMS AND METHODS FOR A SWITCHLESS RADIO FRONT END

PRIORITY CLAIM

This application is a continuation of U.S. application of Ser. No. 15/187,549, filed on Jun. 20, 2016. The disclosure of the above application is incorporated by reference in their entirety as a part of this document.

BACKGROUND

Technical Field

The embodiments described herein are related to wireless communication, and in particular to low cost, low power radio circuit implementations.

Related Art

All wireless communications systems use a radio to transmit and receive wireless communication signals. Radio design for wireless communication systems is well established and most such systems use similar architectures for the transmit and receive circuits; however, as wireless communication capabilities are being embedded into ever more and ever smaller devices, conventional radio circuit designs struggle to provide the low cost and low power capabilities that such devices require.

FIG. 4 is a diagram illustrating a block diagram of a conventional wireless communication circuit 100. As can be seen circuit 100 comprises a digital section 102 and a radio section 104. The radio 104 is interfaced with an antenna 106, although it will be understood that certain designs can use or require multiple antennae. The circuit 100 comprises a transmit path ($t_x$) and a receive path ($r_x$). For the transmit path, data signals to be communicated are generated in the digital section 102, which can be a stand-alone circuit or part of a larger digital circuit, and sent to the radio 104. The data signals are then transformed by radio 104 into signals that can be transmitted via antenna 106.

Conversely, in the receive path, signals received by antenna 106 are transformed by radio 104 into digital signals that can be processed by digital circuit 102.

FIG. 5 is a block diagram illustrating a more detailed view of the conventional radio 104; however, it will be understood that the diagram of FIG. 5 is still very high level and that many components are not illustrated. As can be seen, the transmit path comprises a Digital-to-Analog Converter (DAC) 202 configured to convert digital data signals generated by digital circuit 102 into analog signals. The analog signals can then be modulated onto a carrier signal, produced by synthesizer 218, by modulator 204. The modulated signal is then amplified by Power Amplifier (PA) 206 and transmitted via antenna 210.

In the receive path, signals received by antenna 210 are sent to Low Noise Amplifier (LNA) 212, which is configured to amplify data signals included in the signals received by antenna 210. The amplified data signals are demodulated in demodulator 214, to produce analog data signals that are then converted to digital data signals in Analog- to Digital Converter (ADC) 216 for processing by digital circuit 102.

Because the transmit and receive paths share antenna 210, a switch 208 is typically included to switch between the transmit and receive paths. Systems that use communication circuits such as circuit 100 are configured such that devices transmit and receive at certain, non-overlapping intervals, such that the devices do not transmit and receive at the same time. This is required so that the signals being transmitted do not interfere with those being received and vice versa.

Accordingly, switch 208 can be used to switch from the transmit path, during the transmission window and the receive path during the receive window, while isolating one path from the other to prevent interference. But the inclusion of the switch has some downside, especially for low power or low cost applications. Since there is a cost associated with the switch 208, its inclusion obviously drives up the overall costs of the design. But from a low power point of view, the switch 208 inherently introduces some insertion loss. Losses of this sort inherently lead to increased power, which is needed to overcome the loss. Thus, the switch 208 increases the cost and power requirements.

SUMMARY

Systems and methods for including low cost and low power radio circuits are described herein.

According to one aspect, a radio circuit comprises an antenna; a differential power amplifier, comprising differential transmit inputs and differential transmit outputs, configured to amplify differential transmit signals received via the differential transmit inputs and output the amplified differential transmit signals via the differential transmit outputs; a differential low noise amplifier, comprising differential receive inputs and differential receive outputs, configured to receive differential receive signals via the differential receive inputs and output amplified differential receive signals via the differential receive outputs; and a transformer comprising a primary winding and a secondary winding, the primary winding coupled with the differential transmit outputs of the power amplifier and the differential receive inputs of the low noise amplifier and the secondary winding coupled with the antenna.

A wireless communication device, comprises an antenna; a digital circuit configured to generate digital transmit signals and process digital receive signals; a radio circuit, coupled with the digital circuit, the radio circuit comprising: a differential power amplifier, comprising differential transmit inputs and differential transmit outputs, configured to amplify differential transmit signals received via the differential transmit inputs and output the amplified differential transmit signals via the differential transmit outputs, a differential low noise amplifier, comprising differential receive inputs and differential receive outputs, configured to receive differential receive signals via the differential receive inputs and output amplified differential receive signals via the differential receive outputs, and a transformer comprising a primary winding and a secondary winding, the primary winding coupled with the differential transmit outputs of the power amplifier and the differential receive inputs of the low noise amplifier and the secondary winding coupled with the antenna.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

In the embodiments described herein, various components of various circuits are described. It will be understood that the embodiments are by way of example only and that the descriptions do not necessarily include all of the components necessary for a fully functional circuit. Rather, certain components are shown in order to illustrate the principals described herein.

Figure 1:
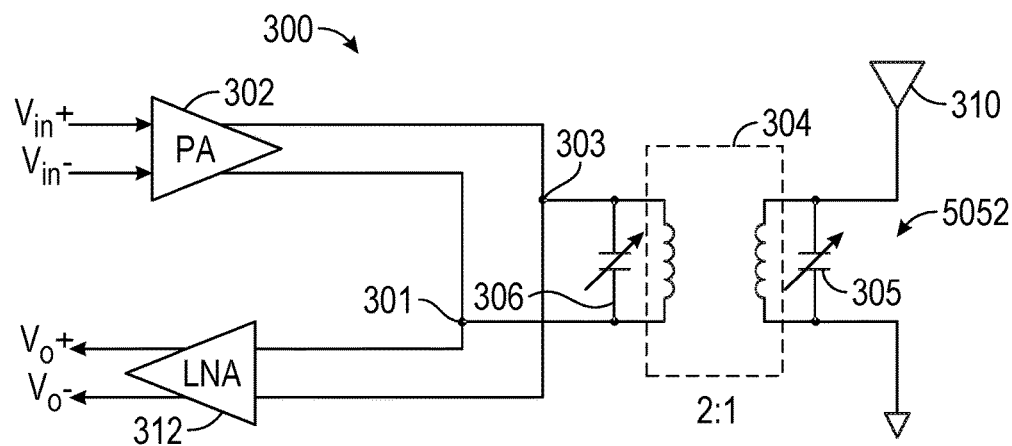
FIG. 1 is a diagram illustrating an example radio circuit configured in accordance with one embodiment.

FIG. 1 is a diagram illustrating a portion of a radio circuit 300 configured in accordance with one example embodiment of the systems and methods described herein. As can be seen, circuit 300 comprises a differential PA 302 and a differential LNA 312. A differential amplifier is a type of electronic amplifier that amplifies the difference between two input voltages but suppresses any voltage common to the two inputs. It is an analog circuit with two inputs Vin− and Vin+ and typically two outputs where the difference between the two outputs is ideally proportional to the difference between the two input voltages.

In the example of FIG. 3, differential outputs from PA 302 are connected across the primary windings of a transformer 304. The terminals of the primary windings of transformer 304 are also connected to the differential input of LNA 312. One side of the secondary windings of the transformer 304 is connected with antenna 310, while the other side is grounded. Thus, the transformer 304 is a differential to single-ended transformer in transmit mode and a single ended to differential transformer in receive mode.

Adjustable capacitors 306 and 308 can be coupled across the primary and secondary windings, respectively. It will be understood that a resonant transformer is an electrical component which consists of two high Q coils with capacitors connected across the windings to make two coupled LC circuits. In this case, the capacitors are variable in order to account for the loading of the PA 302 on operation of the receive path, and the loading of LNA 312 on operation of the transmit path.

Transformer 304 can be configured for step-up or step-down voltage or current conversion.

The impedance of the antenna 310 must be matched to that of the circuit to which it is interfaced. When PA 302 is transmitting, LNA 312 will affect the impedance as seen by antenna 310. The capacitance of capacitors 306 and 308 can be adjusted to offset this additional loading. Similarly, when LNA 312 is receiving signals via antenna 310, PA 302 will affect the impedance match seen by antenna 310. Again, the capacitance of capacitors 306 and 308 can be adjusted to offset this additional loading.

The capacitance of variable capacitors 306 and 308 can be controlled by the digital control circuitry.

Figure 2A:
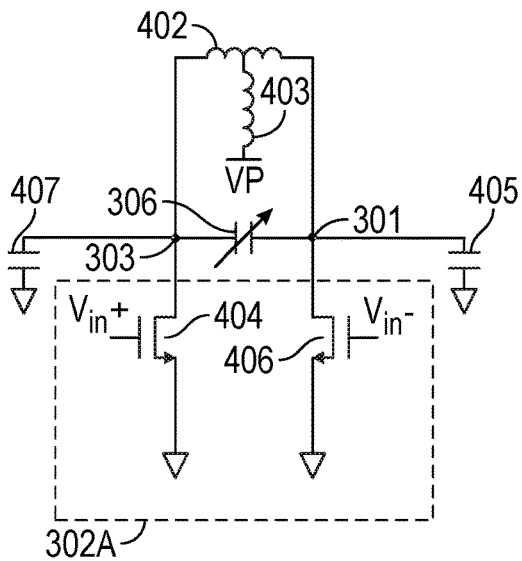
FIG. 2A is a diagram illustrating an example implementation of a power amplifier that can be included in the circuit of FIG. 1.

FIG. 2A is a circuit diagram illustrating one example embodiment of differential PA 302A in accordance with the systems and methods described herein. Primary winding 402 of transformer 304 and capacitor 306 are shown interfaced with PA 302A. In this example, transformer 304 is a center taped transformer and therefore the center tap of winding 402 is shown and is coupled with a voltage (VP) that is derived from the power supply (VDD).

The center tap can be connected to VP via an optional inductor 403. Further, optional capacitors 405 and 407 can be included between terminals 301 and 303 and ground. The optional inductor 403 and capacitors 405 and 407 can improve performance when the amplifier 302 is operated as a switching amplifier.

As can be seen, in this example, PA 302A comprises a pair of transistors 404 and 406 that are configured as a differential pair. The differential transmit signals (Vin−; Vin+) are interfaced with the gates of the transistors 404 and 406. The output signals are then presented to transformer 304 at terminals 301 and 303.

Figure 2B:
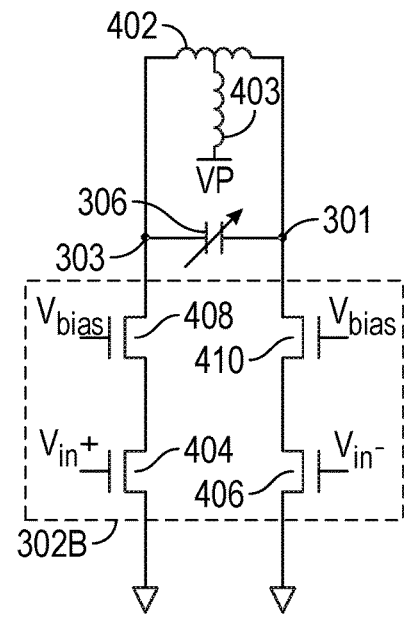
FIG. 2B is a diagram illustrating another example implementation of a power amplifier that can be included in the circuit of FIG. 1.

FIG. 2B is a circuit diagram illustrating another example embodiment of differential PA 302B in accordance with the systems and methods described herein. In this embodiment, PA 302B includes cascode transistors 408 and 410. A biasing voltage (Vbias) can be applied to the gates of transistors 408 and 410 in order to bias the cascade transistors 408 and 410 of PA 302B.

Depending on the biasing of the main transistors 404 and 406 at the input of PA 302, it can operate in linear mode, e.g., as a class A amplifier; in quasi-liner mode, e.g., as a class B or class AB amplifier, or in switching mode, e.g., as a current-mode class D, voltage-mode class D, class, E, Class F, etc., amplifier.

Figure 3A:
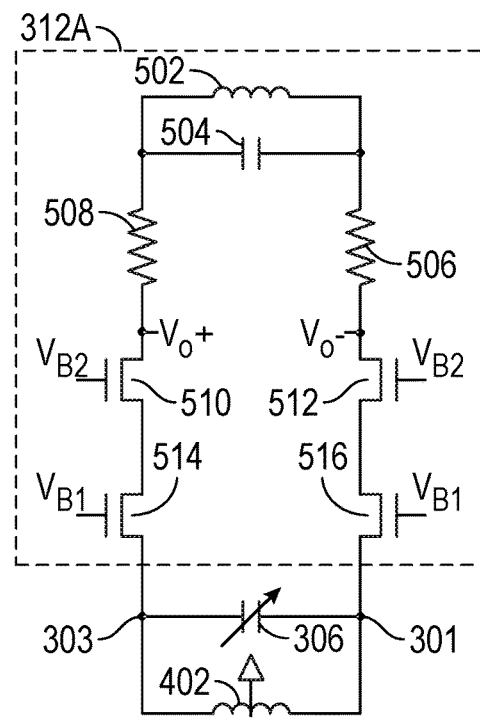
FIG. 3A is a diagram illustrating an example implementation of a low noise amplifier that can be included in the circuit of FIG. 1.

FIG. 3A is a circuit diagram illustrating an example embodiment of LNA 312A in accordance with the systems and methods described herein. The configuration of FIG. 3 can be referred to as a common gate configuration, or a common gate LNA 312A. Again, in this example, transformer 304 is a center tapped transformer and the center tap for primary winding 402 is illustrated as being grounded in this example. The inputs of LNA 312A are connected to the primary winding at terminals 301 and 303. The output receive signals (Vo−; Vo+) are presented at the drains of transistors 510 and 512.

LNA 312 comprises a pair of differential pair transistors 514;516 and 510;512 respectively. The pair of transistors 514 and 516 are the main transistors. Transistors 514 and 516 can be optional, but can be included to improve the performance by lowering the input impedance. A first biasing voltage (VB1) can be applied to the gates of transistors 514 and 516 and a second biasing voltage (VB2) can be applied to the gates of transistors 510 and 512.

LNA 312 also comprises an optional load comprising resistors 506 and 508 connected in series with the differential pairs and capacitor 504 and inductor 502 connected parallel therewith. But it will be understood that the load can also optimally comprise a purely resistive load.

As noted above, when the circuit 300 is transmitting, the center tap of the primary winding 402 can be connected to VP, but when it is receiving, the center tap is connected to ground. Accordingly, a switch can be included that is, e.g., controlled by the digital circuitry in order to switch the center tap between VP and ground.

Figure 3B:
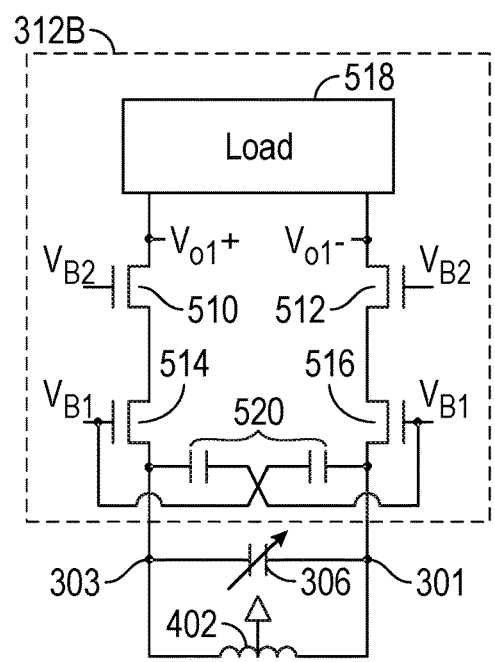
FIG. 3B is a diagram illustrating another example implementation of a low noise amplifier that can be included in the circuit of FIG. 1.
Figure 4:
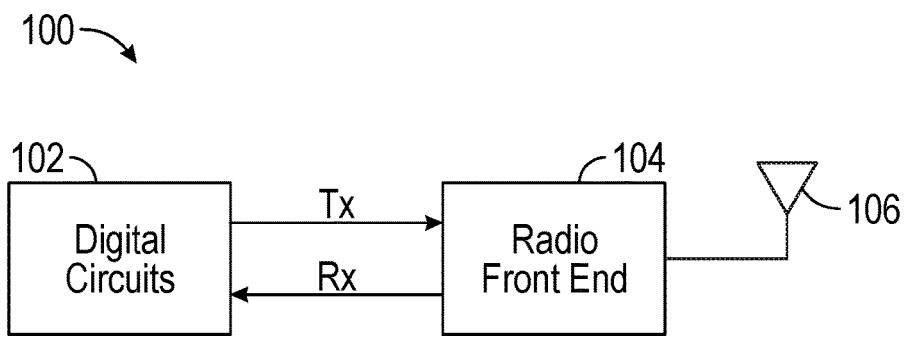
FIG. 4 is a diagram illustrating a conventional wireless communication circuit.
Figure 5:
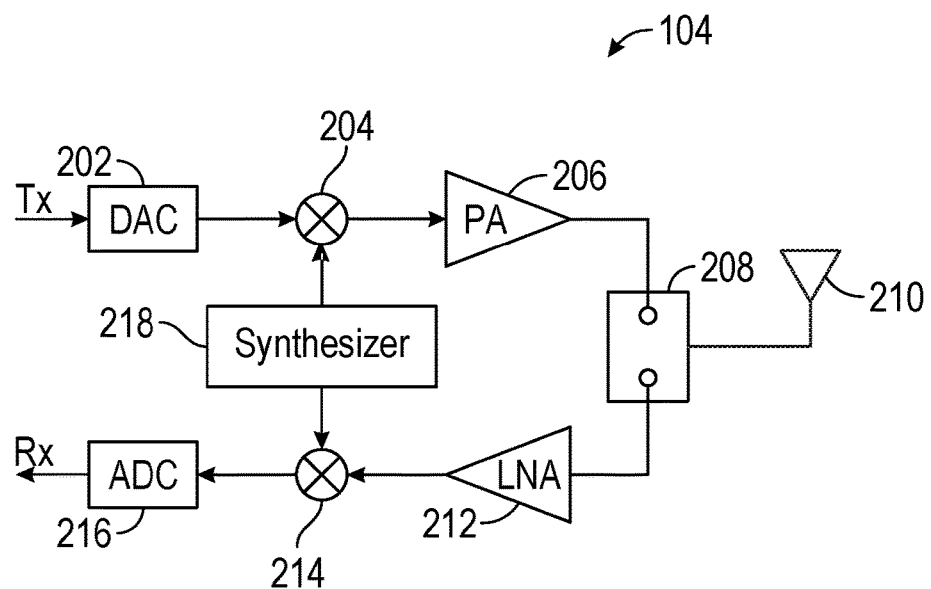
FIG. 5 is a diagram illustrating a radio circuit that can be included in the circuit of FIG. 4.

FIG. 3B is a diagram illustrating another example embodiment of an LNA 312B configured in accordance with the systems and methods described herein. As can be seen LNA 312B includes a load 518 that can be inductive or resistive. LNA 312B also includes optional cascade devices 510 and 512. In addition, LNA 312B includes cross coupled capacitors 520, which can also be added to improve performance.

Thus, the conventional antenna switch can be eliminated thus reducing the power needed to run circuit 300 and lower the costs.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed:

1. A radio circuit, comprising:
    an antenna;
    a differential power amplifier, comprising differential transmit inputs and differential transmit outputs, configured to amplify differential transmit signals received via the differential transmit inputs and output the amplified differential transmit signals via the differential transmit outputs;
    a differential low noise amplifier, comprising differential receive inputs and differential receive outputs, configured to receive differential receive signals via the differential receive inputs and output amplified differential receive signals via the differential receive outputs; and
    a transformer comprising a primary winding and a secondary winding, the primary winding coupled at the same points with the differential transmit outputs of the power amplifier and the differential receive inputs of the low noise amplifier and the secondary winding coupled with the antenna, wherein the primary winding is center tapped.

2. The radio circuit of claim 1, further comprising a first adjustable capacitor connected across the primary winding, and a second adjustable capacitor coupled across the secondary winding.

3. The radio circuit of claim 1, wherein one side of the secondary winding is coupled with the antenna, and the other side is coupled to ground.

4. The radio circuit of claim 1, wherein the differential power amplifier comprises an output stage and a biasing stage.

5. The radio circuit of claim 1, wherein the center tap is coupled with a voltage derived from a power supply when signals are being transmitted via the power amplifier, and coupled to ground when signals are being received via the low noise amplifier.

6. The radio circuit of claim 1, wherein the differential low noise amplifier comprises an input stage and a biasing stage.

7. A wireless communication device, comprising:
    an antenna;
    a digital circuit configured to generate digital transmit signals and process digital receive signals;
    a radio circuit, coupled with the digital circuit, the radio circuit comprising:
        a differential power amplifier, comprising differential transmit inputs and differential transmit outputs, configured to amplify differential transmit signals received via the differential transmit inputs and output the amplified differential transmit signals via the differential transmit outputs,
        a differential low noise amplifier, comprising differential receive inputs and differential receive outputs, configured to receive differential receive signals via the differential receive inputs and output amplified differential receive signals via the differential receive outputs, and
        a transformer comprising a primary winding and a secondary winding, the primary winding coupled with the differential transmit outputs of the power amplifier and the differential receive inputs of the low noise amplifier and the secondary winding coupled with the antenna, wherein the primary winding is center tapped.

8. The wireless communication device of claim 7, wherein the radio circuit further comprises a first adjustable capacitor connected across the primary winding, and a second adjustable capacitor coupled across the secondary winding.

9. The wireless communication device of claim 7, wherein one side of the secondary winding is coupled with the antenna, and the other side is coupled to ground.

10. The wireless communication device of claim 7, wherein the differential power amplifier comprises an output stage and a biasing stage.

11. The wireless communication device of claim 7, wherein the differential low noise amplifier comprises an input stage and a biasing stage.

12. The wireless communication device of claim 7, wherein the primary winding coupled at the same points with the differential transmit outputs of the power amplifier and the differential receive inputs of the low noise amplifier and the secondary winding coupled with the antenna.

13. The wireless communication device of claim 7, wherein the center tap is coupled with a voltage derived from a power supply when signals are being transmitted via the power amplifier, and coupled to ground when signals are being received via the low noise amplifier.

* * * * *